United States Patent
Wang et al.

(10) Patent No.: US 8,754,673 B1
(45) Date of Patent: Jun. 17, 2014

(54) ADAPTIVE REFERENCE VOLTAGE GENERATORS THAT SUPPORT HIGH SPEED SIGNAL DETECTION

(71) Applicant: Integrated Device Technology, Inc., San Jose, CA (US)

(72) Inventors: Wei Wang, Shanghai (CN); Yumin Zhang, Shanghai (CN)

(73) Assignee: Integrated Device Technology inc., San Jose, CA (US)

( * ) Notice: Subject to any disclaimer, the term of this patent is extended or adjusted under 35 U.S.C. 154(b) by 0 days.

(21) Appl. No.: 13/936,900

(22) Filed: Jul. 8, 2013

Related U.S. Application Data

(60) Provisional application No. 61/766,243, filed on Feb. 19, 2013.

(51) Int. Cl.
*H03K 5/22* (2006.01)
(52) U.S. Cl.
USPC .............................................. 327/72; 327/68
(58) Field of Classification Search
CPC ....................................................... H03K 5/08
USPC ............ 327/530, 538, 540, 543, 545, 547, 68, 327/72, 74
See application file for complete search history.

(56) References Cited

U.S. PATENT DOCUMENTS

| 8,068,354 | B2 | 11/2011 | Wang et al. |
| 2005/0035811 | A1* | 2/2005 | Shin ............................. 327/536 |
| 2009/0051392 | A1* | 2/2009 | Maeda et al. .................. 327/72 |

* cited by examiner

*Primary Examiner* — Lincoln Donovan
*Assistant Examiner* — Jung H Kim
(74) *Attorney, Agent, or Firm* — Myers, Bigel, et al.

(57) ABSTRACT

An integrated circuit device includes a reference voltage generator, which is configured to generate an adaptive reference voltage (Vref) that varies inversely relative to changes in magnitude of a data signal (DATA) received at an input thereof. This reference voltage generator includes a totem pole arrangement of at least two variable impedance elements having control terminals capacitively coupled (by respective capacitors) to the input. A current mirror is electrically coupled to the totem pole arrangement of at least two variable impedance elements. A comparator is also included. The comparator has a first input terminal that receives the adaptive reference voltage and a second input terminal that receives the data signal.

15 Claims, 3 Drawing Sheets

US 8,754,673 B1

ADAPTIVE REFERENCE VOLTAGE GENERATORS THAT SUPPORT HIGH SPEED SIGNAL DETECTION

REFERENCE TO PRIORITY APPLICATION

This application claims priority to U.S. Provisional Application Ser. No. 61/766,243, filed Feb. 19, 2013, the disclosure of which is hereby incorporated herein by reference.

BACKGROUND OF THE INVENTION

Signals in high speed systems can be deteriorated by inter-symbol interference (ISI) and cross talk, which often make detecting such signals hard to realize. For example, as illustrated by FIG. 1, a high frequency pseudo-random binary sequence (PRBS) may be transmitted across a printed circuit board (PCB) and through input/output connectors, cables and bonding wire. As shown, these data streams may be distorted by the low pass effect of these transmission components and cross-talk caused by the high speed toggling of signals on other channels (not shown). Thus, as shown by the right side of FIG. 1, the output from the PCB may not produce a correct data sequence when submitted to a conventional comparator, which is referenced to a fixed voltage (Vref). For example, if a "long" 1 binary input sequence is interrupted by a "short" 0, as illustrated, a comparator receiving the output binary sequence may fail to detect the "short" 0 because the output binary sequence fails to drop below the reference voltage Vref. Likewise, if a "long" 0 binary input sequence is interrupted by a "short" 1, a comparator receiving the output binary sequence may fail to detect the "short" 1 because the output binary sequence fails to rise above the reference voltage Vref. Accordingly, if the binary input sequence equals "11111011110000100000", the output binary sequence may be detected incorrectly as "11111111110000000000."

SUMMARY OF THE INVENTION

An integrated circuit device according to embodiments of the invention includes a reference voltage generator, which is configured to generate an adaptive reference voltage (Vref) that varies inversely relative to changes in magnitude of a data signal (DATA) received at an input thereof. This reference voltage generator can include a totem pole arrangement of at least two variable impedance elements having control terminals capacitively coupled (by respective capacitors) to the input. These at least two variable impedance elements can include a variable pull-up impedance element and a variable pull-down impedance element, which are commonly connected to an output terminal of the reference voltage generator. A current mirror may also be provided, which is electrically coupled to the totem pole arrangement of at least two variable impedance elements. This totem pole arrangement of at least two variable impedance elements may include a pair of fixed-value resistors commonly connected to the output terminal. Moreover, a first one of the at least two variable impedance elements is configured as a parallel combination of a fixed-value resistor and a first MOS transistor having a gate terminal capacitively coupled to the data signal. A second one of the at least two variable impedance elements is configured as a parallel combination of a fixed-value resistor and a second MOS transistor having a gate terminal capacitively coupled to the data signal.

According to some of these embodiments of the invention, a first capacitor may be provided, which has a first terminal electrically connected to a gate terminal of the first MOS transistor and a second terminal configured to receive the data signal at the input. A second capacitor is also provided, which has a first terminal electrically connected to a gate terminal of the second MOS transistor and a second terminal configured to receive the data signal at the input. A comparator may also be provided, which has a first input terminal that receives the adaptive reference voltage and a second input terminal that receives the data signal.

According to still further embodiments of the invention, the totem pole arrangement of at least two variable impedance elements may include a totem pole arrangement of four fixed-value resistors electrically connected in series. This totem pole arrangement of at least two variable impedance elements can also include a PMOS transistor electrically connected in parallel with one of the four fixed-value resistors and an NMOS transistor electrically connected in parallel with another one of the four fixed-value resistors.

Additional embodiments of the invention include a comparator circuit, which includes a reference voltage generator and a comparator. The reference voltage generator is configured to generate an adaptive reference voltage, which fluctuates in magnitude in response to a data signal, and the comparator has a first input terminal configured to receive the adaptive reference voltage and a second input terminal configured to receive the data signal. According to some of these embodiments of the invention, the adaptive reference voltage fluctuates inversely relative to low-to-high and high-to-low changes in a magnitude of the data signal and the reference voltage generator may include a totem pole arrangement of at least four impedance elements.

According to still further embodiments of the invention, the reference voltage generator may be configured as a totem pole arrangement of at least two pairs of matched impedance elements. A first of the two pairs of matched impedance elements includes fixed-value resistors and a second of the two pairs of matched impedance elements includes varistors having magnitudes that fluctuate in opposite directions in response to the low-to-high and high-to-low changes in the magnitude of the data signal. The reference voltage generator may also include a current mirror circuit, which is electrically coupled to the second of the two pair of matched impedance elements. In some embodiments of the invention, the first of the varistors may include a parallel combination of a first fixed-value resistor and an NMOS transistor. The second of the varistors may include a parallel combination of a second fixed-value resistor and a PMOS transistor. A pair of serially-connected sense capacitors may also be provided, which are electrically coupled across gate terminals of the NMOS and PMOS transistors. A common node, which is responsive to the data signal at an input of the reference voltage generator, may extend between the pair of sense capacitors.

DETAILED DESCRIPTION OF EMBODIMENTS

Figures 1, 2A:
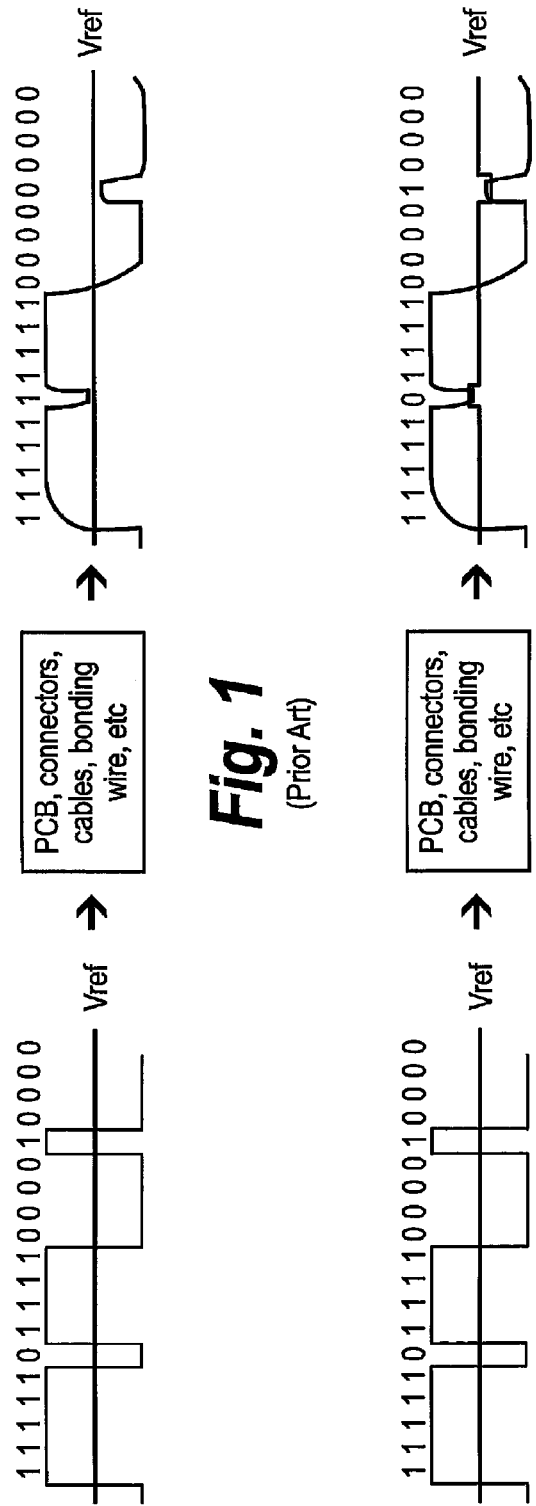
FIG. 1 illustrates transmission and detection of a high frequency pseudo-random binary sequence (PRBS) across a printed circuit board (PCB), connectors, cables and bonding wire, etc, according to the prior art.
FIG. 2A illustrates transmission and detection of a high frequency pseudo-random binary sequence (PRBS) across a printed circuit board (PCB), connectors, cables and bonding wire, etc, using an adaptive reference voltage generated according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 2A, the accuracy of detection of a high frequency pseudo-random binary sequence (PRBS) may be enhanced using an adaptive reference voltage generator according to an embodiment of the present invention. As shown by FIG. 2A, the accuracy of detection of a high frequency pseudo-random binary sequence (PRBS) across a printed circuit board (PCB) (and connectors, cables and bonding wire, etc.) may be enhanced by using an adaptive reference voltage (Vref), which is generated so that it fluctuates inversely relative to low-to-high and high-to-low changes in a magnitude of the binary sequence (e.g., data signal). Thus, as illustrated by the right side of FIG. 2A, the adaptive reference voltage may itself be treated as a varying sequence that switches relatively low when the binary data sequence switches high and switches relatively high when the binary data sequence switches low. Thus, if the binary input sequence equals "1111101111000010000", as illustrated by FIG. 2A, the output binary sequence may be detected correctly as "1111101111000010000" by using an adaptive reference voltage, as explained more fully hereinbelow with respect to FIGS. 2B-2C.

Figure 2B:
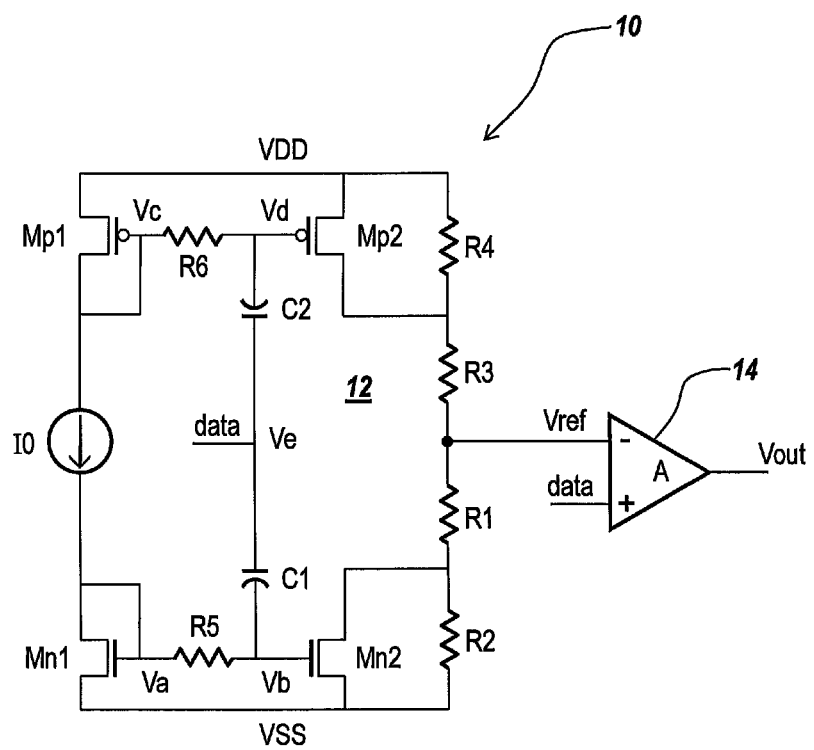
FIG. 2B is an electrical schematic of a comparator circuit that may be used to perform accurate detection of a high frequency pseudo-random binary sequence (PRBS) by generating the adaptive reference voltage of FIG. 2A, according to an embodiment of the invention.

FIG. 2B illustrates a comparator circuit 10, which includes an adaptive reference voltage generator 12 and a comparator 14, according to embodiments of the invention. The adaptive reference voltage generator 12 includes a plurality of fixed-value resistors, where R1=R3 and R2=R4. These resistors may have values ranging from about 1 kΩ to about 30 kΩ. An NMOS pull-down transistor MN2 is biased by NMOS transistor MN1 and their gate electrodes are connected to each other through a relatively large resistor R5, where R5 is typically greater than R1-R4. Similarly, PMOS pull-up transistor MP2 is biased through PMOS transistor MP1 and their gate electrodes are connected to each other through a relatively large resistor R6, where R6 is typically greater than R1-R4. These relatively large resistors R5 and R6 are used to prevent large signal swings at nodes Va and Vc, which are located at the gate terminals of biasing transistors MN1 and MP1, respectively. As will be understood by those skilled in the art, the biasing transistors MN1 and MP1 and a current source I0 are configured as a current mirror. Thus, as described herein, the adaptive reference voltage generator 12 includes a totem pole arrangement of four impedance elements, which may include two pairs of matched impedance elements. The first of the two pairs of matched impedance elements may include resistors R1 and R3 and the second of the two pairs of matched impedance elements may include first and second varistors having magnitudes that fluctuate in opposite directions in response to the low-to-high and high-to-low changes in the magnitude of the data signal (DATA). The first varistor may be defined by the parallel combination of R2 and MN2, which operate as a variable pull-down impedance, and the second varistor may be defined by the parallel combination of R4 and MP2, which operate as a variable pull-up impedance.

As further illustrated by FIG. 2B, the adaptive reference voltage generator 12 includes a totem pole arrangement of fixed-value resistors R1-R4, connected as illustrated. The pull-down impedance of the generator 12 includes R1+R2//R_MN2 and the pull-up impedance of the generator 12 includes R3+R4//R_MP2. A sense capacitor C1 is electrically connected between the input terminal (DATA) at node Ve and node Vb, which is the gate electrode (e.g., control terminal) of NMOS transistor MN2. Another sense capacitor C2 (e.g., C1=C2) is electrically connected between the input terminal at node Ve and node Vd, which is the gate electrode (e.g., control terminal) of PMOS transistor MP2. Transistors MN2 and MP2 are preferably biased into saturation when the voltage received at the input terminal (DATA) is stable.

The pull-up and pull-down impedances are configured to be equal, which means Vref can equal VDD/2 at the output of the adaptive reference voltage generator 12 under quiescent conditions. In addition, the resistance R1 is preferably greater than R2//R_MN2 and the resistance R3 is greater than R4//R_MP2. As illustrated, the comparator (or slicer) 14 is used to compare DATA against Vref so that when DATA is greater than Vref, Vout becomes high (e.g., logic 1) and when DATA is less than Vref, Vout becomes low (e.g., logic 0).

The illustrated configuration of the adaptive reference voltage generator 12 supports the generation of an adaptive reference voltage (Vref). For example, when the received DATA switches from a logic 1 value to a logic 0 value (i.e., 1→0), capacitors C1 and C2 quickly sense the high frequency voltage change and pull the voltages at nodes Vb and Vd to lower levels, which causes the drain-to-source resistance (Rds) of MN2 to increase and the and the drain-to-source resistance (Rds) of MP2 to decrease. This means the pull-down impedance of R1+(R2//R_MN2) increases and the pull-up impedance of R3+(R4//R_MP2) decreases, which means Vref at the output of the adaptive voltage reference generator 12 becomes larger than VDD/2. Thus, in the event the input DATA switches from a long "1" to a short "0", this higher Vref enhances the accuracy of the comparator 14 in detecting the short "0."

Alternatively, when the received DATA switches from a logic 0 value to a logic 1 value (i.e., 0→1), capacitors C1 and C2 quickly sense the high frequency voltage change and pull the voltages at nodes Vb and Vd to higher, which causes the drain-to-source resistance (Rds) of MN2 to decrease and the and the drain-to-source resistance (Rds) of MP2 to increase. This means the pull-down impedance of R1+(R2//R_MN2) decreases and the pull-up impedance of R3+(R4//R_MP2) increases, which means Vref at the output of the adaptive voltage reference generator 12 becomes smaller than VDD/2. Thus, in the event the input DATA switches from a long "0" to a short "1", this smaller Vref enhances the accuracy of the comparator 14 in detecting the short "1."

Figure 2C:
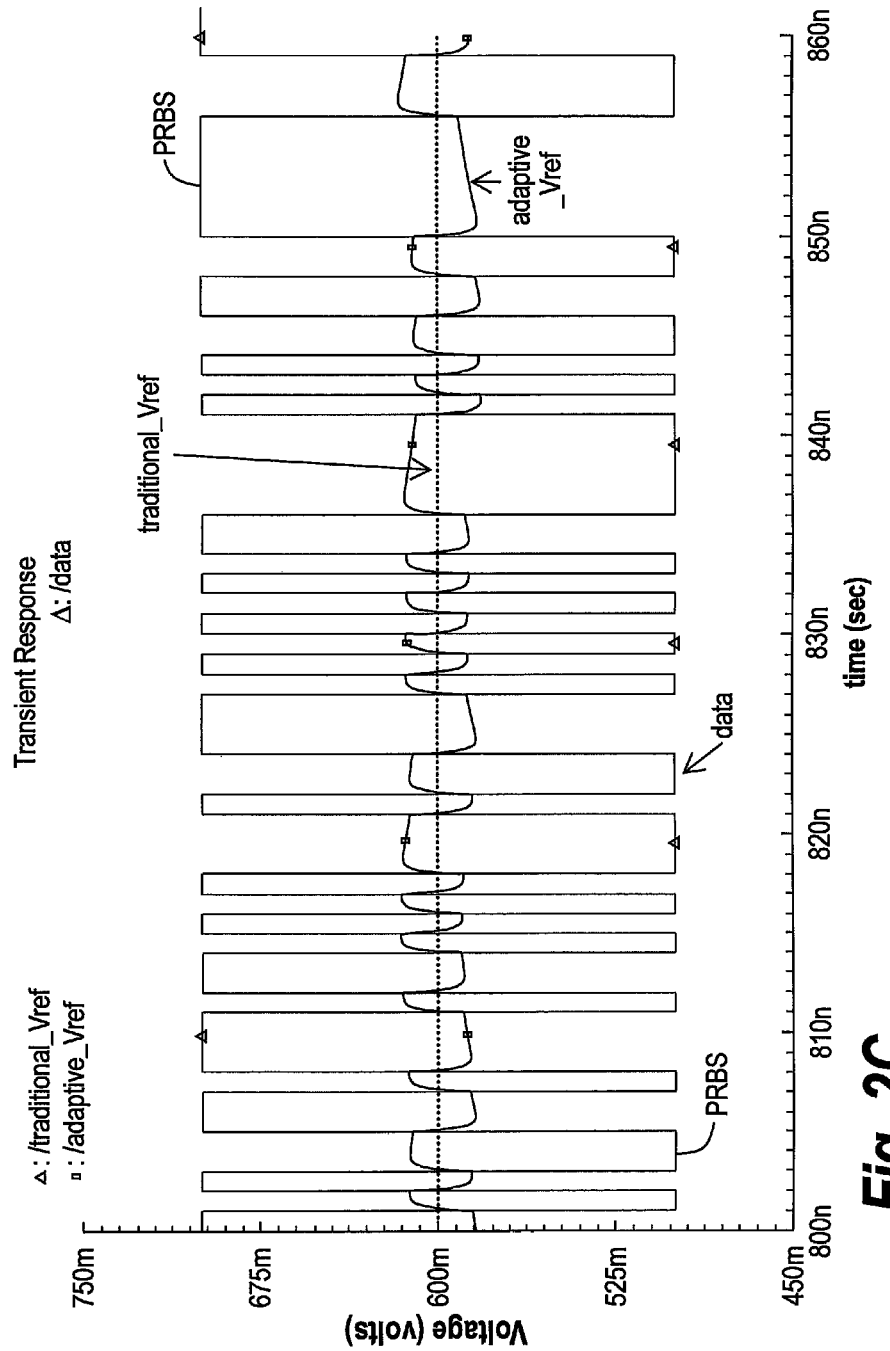
FIG. 2C is a timing diagram that illustrates how an adaptive reference voltage will vary above and below a predetermined (i.e., traditional) reference voltage in response to an exemplary pseudo-random binary sequence.

FIG. 2C is a timing diagram that illustrates how an adaptive reference voltage will vary above and below a predetermined reference voltage (e.g., 600 mV=VDD/2) in response to an exemplary pseudo-random binary sequence. As shown during the time period from 800 ns to 860 ns, a 1 GHz pseudo-random binary sequence of 1s and 0s, which support a DC voltage of 600 mV and range between 500 mV ("0") and 700 mV ("1"), may be received at the data input terminals (DATA) of the comparator circuit 10 of FIG. 2B. As explained hereinabove, each low-to-high transition of DATA results in a relatively high-to-low transition in the adaptive reference voltage Vref (between 580 mV and 620 mV) and each high-to-low transition of DATA results in a relatively low-to-high transition in the adaptive reference voltage Vref, where the magnitude of each transition of the adaptive reference voltage is a function of the impedance ratio R1/(R2//R_MN2) or R3/(R4//R_MP2).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A comparator circuit, comprising:
    a reference voltage generator configured to generate an adaptive reference voltage that fluctuates inversely relative to low-to-high and high-to-low changes in a magnitude of a data signal, said reference voltage generator comprising a totem pole arrangement of at least two pairs of matched impedance elements; and
    a comparator having a first input terminal configured to receive the adaptive reference voltage and a second input terminal configured to receive the data signal;
    wherein a first of the two pairs of matched impedance elements comprise fixed-value resistors and a second of the two pairs of matched impedance elements comprise varistors having magnitudes that fluctuate in opposite directions in response to the low-to-high and high-to-low changes in the magnitude of the data signal.

2. The comparator circuit of claim 1, wherein said reference voltage generator further comprises a current mirror circuit electrically coupled to the second of the two pair of matched impedance elements.

3. The comparator circuit of claim 2, wherein a first of the varistors comprises a parallel combination of a first fixed-value resistor and an NMOS transistor and a second of the varistors comprises a parallel combination of a second fixed-value resistor and a PMOS transistor.

4. The comparator circuit of claim 3, further comprising a pair of sense capacitors electrically coupled across gate terminals of the NMOS and PMOS transistors.

5. The comparator circuit of claim 4, wherein a common node between the pair of sense capacitors is responsive to the data signal.

6. A comparator circuit, comprising:
    a reference voltage generator configured to generate an adaptive reference voltage having a magnitude that varies inversely relative to changes in magnitude of a data signal, which is received at an input of said reference voltage generator; and
    a comparator having a first input terminal configured to receive the adaptive reference voltage and a second input terminal configured to receive the data signal.

7. The comparator circuit of claim 6, wherein said reference voltage generator comprises a totem pole arrangement of at least two variable impedance elements having control terminals capacitively coupled to the input.

8. The comparator circuit of claim 7, wherein the at least two variable impedance elements include a variable pull-up impedance element and a variable pull-down impedance element, which are commonly connected to an output terminal of said reference voltage generator.

9. The comparator circuit of claim 7, further comprising a current mirror electrically coupled to said totem pole arrangement of at least two variable impedance elements.

10. The comparator circuit of claim 8, wherein the totem pole arrangement of at least two variable impedance elements comprises a pair of fixed-value resistors commonly connected to the output terminal.

11. The comparator circuit of claim 8, wherein a first one of the at least two variable impedance elements is configured as a parallel combination of a fixed-value resistor and a first MOS transistor having a gate terminal capacitively coupled to the input.

12. The comparator circuit of claim 11, wherein a second one of the at least two variable impedance elements is configured as a parallel combination of a fixed-value resistor and a second MOS transistor having a gate terminal capacitively coupled to the input.

13. The comparator circuit of claim 12, further comprising:
    a first capacitor having a first terminal electrically connected to a gate terminal of the first MOS transistor and a second terminal configured to receive the data signal; and
    a second capacitor having a first terminal electrically connected to a gate terminal of the second MOS transistor and a second terminal configured to receive the data signal.

14. The comparator circuit of claim 7, wherein the totem pole arrangement of at least two variable impedance elements comprises a totem pole arrangement of four fixed-value resistors electrically connected in series.

15. The comparator circuit of claim 14, wherein the totem pole arrangement of at least two variable impedance elements comprises a PMOS transistor electrically connected in parallel with one of the four fixed-value resistors and an NMOS transistor electrically connected in parallel with another one of the four fixed-value resistors.

* * * * *